(12) United States Patent
Torkkeli (10) Patent No.: US 9,556,021 B2
(45) Date of Patent: *Jan. 31, 2017

(54) METHOD OF MANUFACTURING A MEMS STRUCTURE AND USE OF THE METHOD

(71) Applicant: MURATA MANUFACTURING CO., LTD., Nagaokakyo-shi, Kyoto (JP)

(72) Inventor: Altti Torkkeli, Tuusula (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/706,095

(22) Filed: May 7, 2015

(65) Prior Publication Data

US 2015/0336794 A1 Nov. 26, 2015

(30) Foreign Application Priority Data

May 20, 2014 (FI) .................................... 20145454

(51) Int. Cl.
*B81C 1/00* (2006.01)

(52) U.S. Cl.
CPC ....... *B81C 1/00412* (2013.01); *B81C 1/00373* (2013.01); *B81C 1/00396* (2013.01); *B81C 1/00404* (2013.01); *B81C 1/00531* (2013.01); *B81C 1/00611* (2013.01)

(58) Field of Classification Search
CPC ........................... B81C 1/00539; B81B 7/0032
See application file for complete search history.

(56) References Cited

U.S. PATENT DOCUMENTS

| | | | |
|---|---|---|---|
| 5,045,898 A * | 9/1991 | Chen | H01L 21/76218 257/305 |
| 5,919,548 A * | 7/1999 | Barron | B81C 1/00611 428/138 |
| 6,811,853 B1 | 11/2004 | Sherrer et al. | |
| 7,214,559 B2 | 5/2007 | Kim et al. | |
| 7,998,776 B1 | 8/2011 | Li et al. | |
| 8,043,973 B2 | 10/2011 | Goodlin et al. | |
| 8,210,039 B2 | 7/2012 | Rudolf et al. | |
| 8,394,718 B1 | 3/2013 | Gambino et al. | |
| 2002/0164833 A1 | 11/2002 | Cho | |

(Continued)

OTHER PUBLICATIONS

International Search Report application No. PCT/IB2015/053480 mailed Sep. 2, 2015.

(Continued)

*Primary Examiner* — Mohammad Choudhry
(74) *Attorney, Agent, or Firm* — Squire Patton Boggs (US) LLP (57) ABSTRACT

A method creates MEMS structures by selectively etching a silicon wafer that is patterned by using a masking layer. The method comprises depositing and patterning a first mask on a silicon wafer to define desired first areas on the wafer to be etched. First trenches are etched on parts of the wafer not covered by the first mask. The first trenches are filled with a deposit layer. A part of the deposit layer is removed on desired second areas to be etched and a remainder is left on areas to function as a second mask to define final structures. Parts of the wafer on the desired second areas is etched, and the second mask is removed. A gyroscope or accelerator can be manufactured by dimensioning the structures.

19 Claims, 11 Drawing Sheets

(56) References Cited

U.S. PATENT DOCUMENTS

2004/0097001 A1    5/2004   Hsieh
2004/0232502 A1   11/2004   Hsieh
2007/0194472 A1    8/2007   Naniwa
2009/0065928 A1    3/2009   Lutz et al.
2013/0062713 A1    3/2013   Sakuragi et al.
2013/0126990 A1    5/2013   Wang
2015/0091140 A1    4/2015   Wen

OTHER PUBLICATIONS

Finnish Search Report dated Jan. 20, 2015 corresponding to Finnish Patent Application No. 20145454.
Notice of Allowance dated Jan. 15, 2016, issued in related U.S. Appl. No. 14/712,987.

* cited by examiner

METHOD OF MANUFACTURING A MEMS STRUCTURE AND USE OF THE METHOD

BACKGROUND

Field

The invention is concerned with a method of creating MEMS structures by selectively etching a silicon wafer that is patterned by using a masking layer for defining the structural features of a MEMS device. The invention is also concerned with the use of the method Description of the Related Art Basically, a MEMS device has moving elements under the control of integrated microelectronics and contains microcircuitry on a tiny silicon chip into which some mechanical device, such as a microsensor, and a micro actuator has been manufactured. These microsensors and microactuators constitute the functional elements of micro-electromechanical (MEMS) devices. The physical dimensions of MEMS devices can vary from below one micron to several millimeters.

MEMS devices convert a measured mechanical signal into an electrical signal and MEMS sensors measure the mechanical phenomenon and the electronics then process the information derived from the sensors and through some decision making capability direct the actuators to respond by e.g. moving, positioning, or regulating in order to thereby control the environment for some desired outcome or purpose. MEMS devices can thus comprise both drive elements and sensing elements to perform specific functions.

Examples of systems fabricated using MEMS technology are pressure sensors, accelerators for measuring acceleration of moving objects and gyroscopes for measuring angular velocity of rotating objects.

MEMS devices might be capacitive or make use of piezoelectric transduction.

A key element in a capacitive MEMS device is a variable capacitor formed between a stationary electrode and a movable electrode attached to a suspended proof mass. The movable electrode deflects in response to acceleration in an accelerator or Coriolis force exerted on the proof mass when an angular velocity is applied to a gyroscope and used for measuring this velocity. The amount of deflection can be sensed from changes in capacitance from the changes in the gap between the two electrodes due to deflection.

Accelerometers are acceleration sensors. An inertial mass suspended by springs is acted upon by acceleration forces that cause the mass to be deflected from its initial position. This deflection is converted to an electrical signal, which appears at the sensor output. The application of MEMS technology to accelerometers is a relatively new development.

An accelerator comprises a proof mass, one side of which is fixed to a carrier while the other is suspended. It further comprises means for detecting the movement of the membrane under the effect of acceleration. This constitutes a sensor, which senses acceleration force.

Inertial sensors are a type of accelerometer and are one of the principal commercial products that utilize surface micromachining.

When things rotate around an axis they have angular velocity. Gyroscopes, or gyros, are devices that measure or maintain rotational motion. In a vibrating sensor of angular velocity, i.e. a gyroscope, a certain known primary or seed motion is induced and maintained in the sensor. The desired motion to be measured by means of the sensor is then detected as a deviation of the primary motion.

When MEMS technology is implemented as gyroscopes, these have a structure suspended above a substrate and associated electronics that both senses movement of the suspended structure and deliver the sensed movement to an external computer. The computer processes the sensed data to calculate the property being measured.

Structures for vibrating gyroscopes are formed e.g. by etching a semiconductor wafer to form a proof mass used as a reference in the measurement. The proof mass is suspended by a spring system, such as elastic beams, to a substrate. An electronic drive circuit which may be on the same substrate applies an alternating drive current to driving electrodes which vibrate the proof mass in a drive direction. The electrical drive mechanism vibrates the proof mass along a drive axis (x) and the electrodes build a capacitance together with the proof mass for detecting moves of the proof mass along a sense axis (z) perpendicular to the drive axis. A triple axis MEMS gyroscope, can measure rotation around three x, y, and z axes, while single and dual axis gyros measure the rotation around one or two of these axis.

The electrodes detect displacements of the proof mass in a sensing direction orthogonal to the drive direction. The vibrating gyroscope thus rely on the vibration of this proof mass in one direction and in detecting the Coriolis force generated in the perpendicular direction by the rotational speed. Converting rotation to Coriolis force is the basis of the operation of a gyroscope.

The production process and the technology used for producing the structures with the springs and the beams in MEMS based gyroscopes often lead to quadrature errors, i.e. errors caused by driving the vibrating proof mass along a direction which is not exactly perpendicular to the direction along which the Coriolis movement is measured. The component of the vibrating drive movement in the sense direction generates an output signal caused by the Coriolis force.

One of the most significant problems in micromechanical vibrating sensors of angular velocity is the so called quadrature signal, which is caused by poor dimensional precision in the structures. The quadrature output signal is in phase with the drive signal used for driving the proof mass, while the component for this output signal due to the Coriolis force is shifted.

In the sensor, the quadrature signal can be compensated for by using electric forces, such as e.g. feed-forward compensation, or other electrical compensation.

Compensation by means of electric forces, however, constitutes a challenge to the sensor's electronics requiring either accurate phase control or, possibly, large voltages and separate structures within the sensor.

These miniaturized sensors, actuators, and structures can all be merged onto a common silicon substrate or on separate silicon substrates along with integrated circuits (microelectronics). While the electronics are fabricated using integrated circuit (IC) process sequences, the micromechanical components are fabricated using micromachining processes that selectively etch away parts of a silicon semiconductor wafer or add new structural layers to form the mechanical and electromechanical devices. The wafer is patterned and etched to define the structural features of the sensor in the semiconductor layer. The wafer serves as the substrate for the microelectronic devices built in and over the wafer and, in addition to patterning and etching, undergoes many other microfabrication process steps, such as doping or ion implantation, and deposition of various materials. Finally the individual microcircuits are separated into dies and packaged.

Die refers to one small block of the semiconducting material, on which a given functional circuit, a chip, is fabricated. In the manufacturing of the micro-electronic devices, each individual die contains one of the integrated circuits. During manufacturing, a wafer with up to thousands of circuits is cut into rectangular pieces, each called a die. The integrated circuits are produced in large batches on a single wafer.

Etching is a critically important process module, and every wafer undergoes many etching steps before it is complete. For many etch steps, part of the wafer is protected from the etchant by a "masking" material which resists etching. The masking material is e.g. a photoresist which has been patterned using photolithography. The patterning shows which parts of the wafer should be etched.

In anisotropic etching, the etching rate is different in horizontal and vertical direction. Bias is the difference in lateral dimensions between the feature on mask and the actually etched pattern caused by undercut, which refers to the portion that is etched away under the mask.

The profile of the etched structures has a big impact on the performance of the MEMS device. A typical non-ideality in especially Deep Reactive Ion Etched (DRIE) structures causing problems is that some etches undercut the masking layer and form trenches with sloping sidewalls. The distance of undercutting is called bias. The undercut problem is even more difficult to solve if its extent varies within the structure.

Undercut can be defined as the difference between the mask intended to define the etching boundaries and the actual etched dimensions.

Usually, the undercut is compensated by using mask bias, which means making the mask dimensions larger than the intended trench dimension to compensate for the undercut. However, the biasing of the mask does not provide a complete solution because the DRIE undercut varies across the wafer. This is because there is a radial distribution coming from the geometry of the DRIE tool. Furthermore, some MEMS devices, like z-axis gyros, are more critical to dimension accuracy within one die than to die-to die variations. This is because beam variation within one die causes the primary motion to differ from the designed direction resulting in the so called quadrature signal. The quadrature signal of a Z-axis gyro is highest in such a wafer area where the dimension change rate, as a function of position, is highest.

An attempt to provide a structure of a vibrating sensor of angular velocity, in which the compensation for the quadrature signal is implemented directly by mechanical design, without electric forces is disclosed in U.S. Pat. No. 8,210.039.

U.S. Pat. No. 8,043,973 discloses a method for mask overhang reduction by a process design comprising the use of two masking layers to reduce lateral substrate undercut.

U.S. Pat. No. 7,214,559 discloses a method for fabricating a vertical offset structure by using several etching steps.

SUMMARY

An object of embodiments of the present invention is to provide a structure for compensation for the quadrature signal with improved methods by eliminating non-uniformities within the wafer.

A method of the invention is concerned with creating MEMS structures by selectively etching a silicon wafer that is patterned by using a masking layer for defining the structural features of a MEMS device. In one embodiment, the method comprises depositing and patterning a first mask on a silicon wafer in order to define desired first areas on the wafer to be etched. The first trenches are etched on the parts of the wafer not covered by the first mask in a first trench etching. The first trenches are then filled with a deposit layer. A part of the deposit layer is removed on desired second areas to be etched and the rest of it is left on areas to function as a second mask in order to define final structures. Parts of the wafer on the desired second areas is etched in a second trench etching, and said second mask is removed.

Embodiments of the invention can be used for manufacturing a gyroscope by dimensioning the structures suitable for a gyroscope or for manufacturing an accelerator by dimensioning the structures suitable for an accelerator.

In one embodiment, the first mask is removed after the first trench etching or it can be removed together with a part of the second mask when that is removed.

The third mask can either be deposited after having filled the first trenches with a deposit layer and be removed together with the second mask or alternatively, the third mask can be deposited after the removing of a part of the deposit layer.

A photoresist can be used as the first and/or second and/or third mask material, whereby photolithography is used as the mask patterning method. Silicon dioxide or metal can also be used as the first and/or second and/or third mask material. The first and/or second and/or third mask is remove by a liquid resist stripper or plasma ashing.

Preferably, an anisotropic etching process, such as Deep Reactive Ion Etching, DRIE, is used for the etching steps. usually, the first trench etching results in shallow trenches of 0.4-5 μm and the second trench etching in trenches of the deep of 2-100 μm.

A dielectric material, such as silicon dioxide, $SiO_2$, can be used as the deposit material layer. In that case, it is preferable to use chemical vapor deposition, CVD, for depositing the deposit layer. When metal is used as the deposit material layer (4), a preferable deposition method for depositing the deposit layer is Physical Vapor Deposition, PVD, electrodeposition, or electroless deposition.

In some embodiments, the part of the deposit layer is either chemically removed by an etch-back procedure or by Chemical-Mechanical Planarization, CMP.

Embodiments of the invention provide compensating of wafer-level non-uniformity of undercut by using etching for both the mask and the structure in a way that undercut becomes cancelled.

In the invention, it has been concluded that the beam dimension variation within one die origins from the radial wafer distribution of the etch profile. Z-axis gyros are most sensitive to this error.

Embodiments of the invention are described more in detail by referring to some preferable embodiments and by referring to figures. The invention is not restricted to the details of these embodiments.

DETAILED DESCRIPTION

Figure 1A:
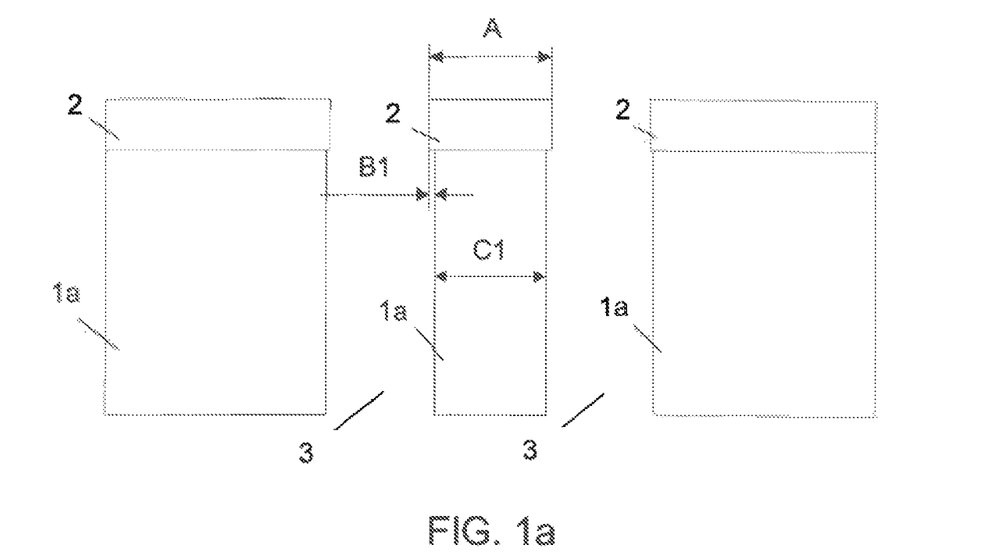
FIGS. 1a and 1b are simplified presentations of non-uniformity as a phenomenon in a DRIE-etched structure causing dimension variations.
Figure 1B:
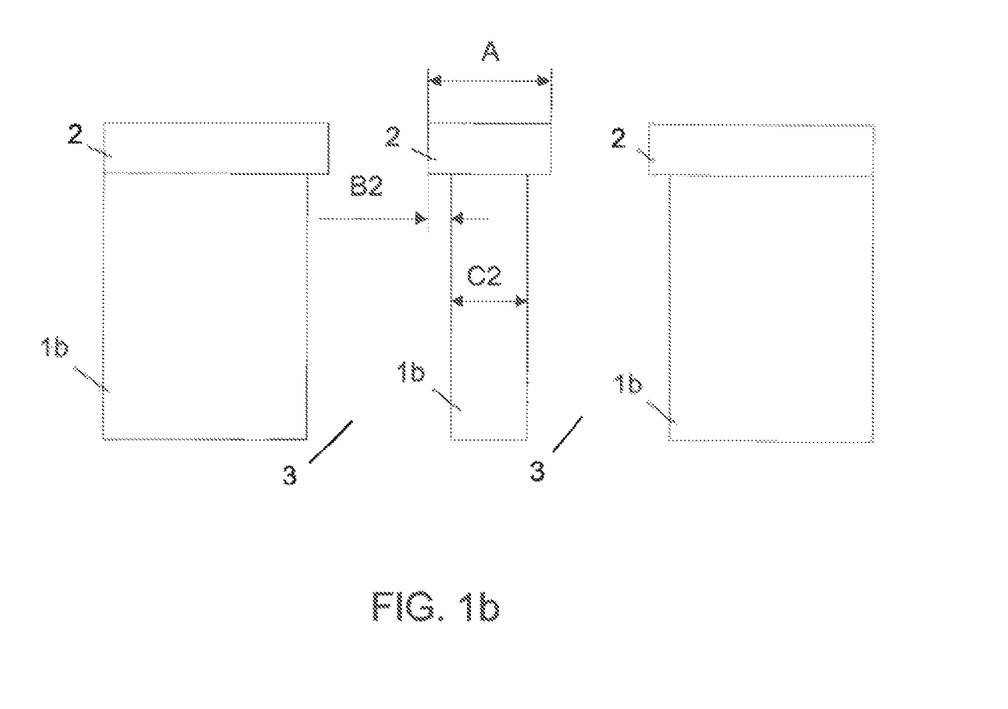

FIGS. 1a and 1b are simplified presentations of non-uniformity in undercut in general in a DRIE-etched structure causing dimension variations in a MEMS structure.

Parts of a top layer silicon wafer have been DRIE-etched on exposed surfaces not covered by a masking layer 2 to form structures 1a and 1b in the top layer wafer. FIGS. 1a and 1b only show the structures 1a and 1b of the top layer wafer until the depth of the etching, and therefore the formed trenches 3 can be seen as spaces only. FIGS. 3-5 present how the top layer wafer 1 is in reality bond to a bottom wafer 11 with an air cavity 9 for the functional structures being formed from parts of the top layer wafer 1. Hereafter, the top layer wafer 1 is called wafer 1.

FIG. 1a shows the structures 1a of a top layer wafer close to the center of the wafer, whereas FIG. 1b shows the structures 1b of a top layer wafer 1 at the wafer edge.

In FIGS. 1a and 1b, A is the horizontal dimension the mask 2 on the actual covered parts of the wafer 1 while dimensions C1 and C2 are the horizontal dimensions of structures formed from the top layer wafer and dimensions B1 and B2 are the distances of the undercut defined as the difference between A and C1/C2, which is the dimension of the portion that is etched away unintentionally under the mask. The whole undercut is defined by 2×B1 or 2×B2, since B1/B2 is the distance of undercut only on one side. Ideally, A should correspond to C1/C2, but the undercut causes the difference B1/B2.

Undercut can be defined as the difference between the mask dimension A intended to define the etching boundaries and the actual etched dimensions. The distance of undercutting is called bias and its extent in the structures varies within the wafer 1. Thus, the etching process causes a larger undercut B2 at the wafer edge than in the wafer center, wherein the undercut B1 is smaller. Therefore the structure dimension C2 is smaller at the wafer edge than the structure dimension C1 in the center of the wafer 1.

In reality, the trenches under the mask have sloping and/or uneven sidewalls since the undercut tends to be less immediately under the mask but. For simplification, the trenches 3 are, however, presented with straight sidewalls in FIGS. 1a and 1b.

Figure 2A:
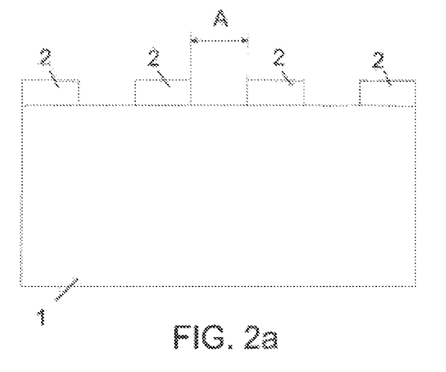
FIGS. 2a-2r illustrates the method of the invention principally to compensate for non-uniformities on wafer level.
Figure 2B:
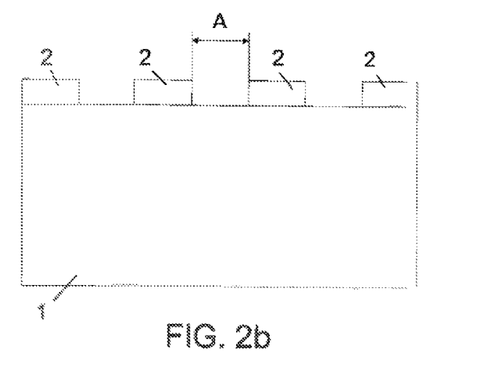
Figure 2C:
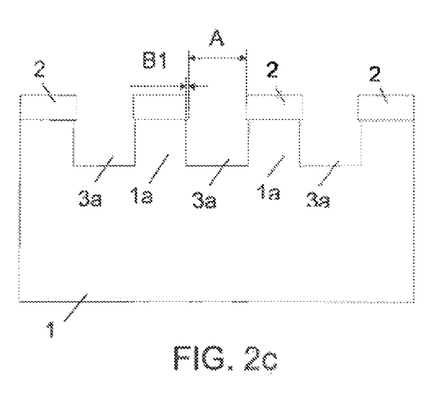
Figure 2D:
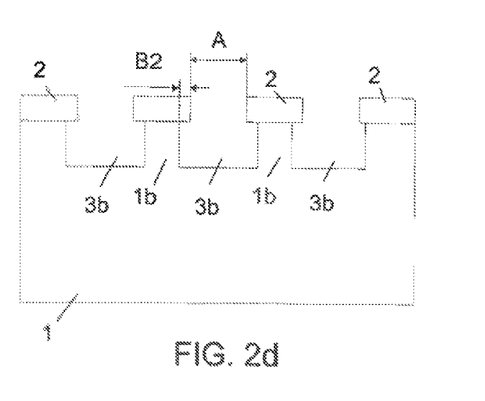
Figure 2E:
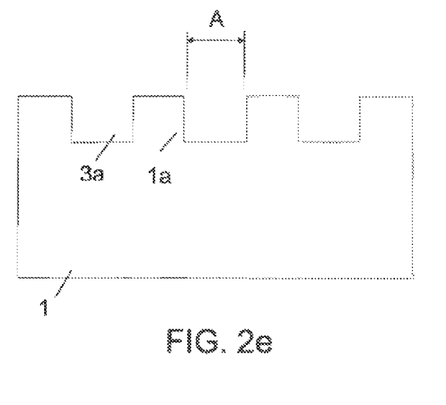
Figure 2F:
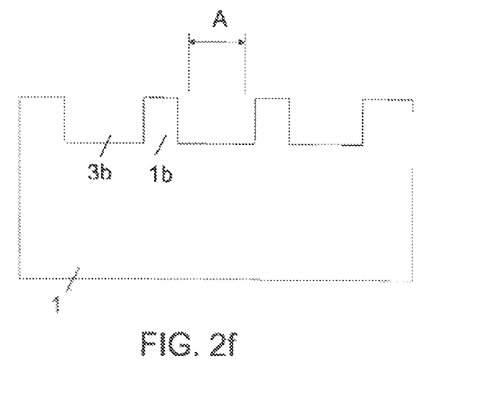
Figure 2G:
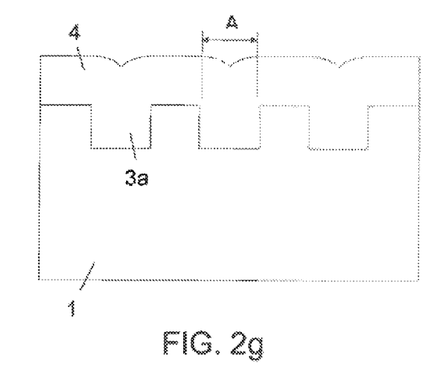
Figure 2H:
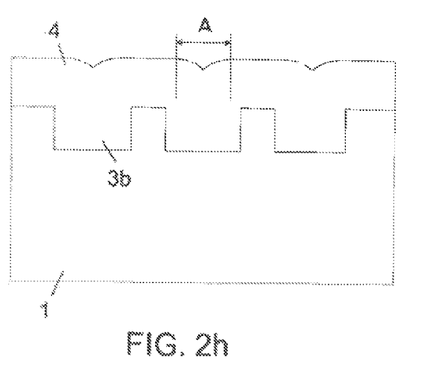
Figure 2I:
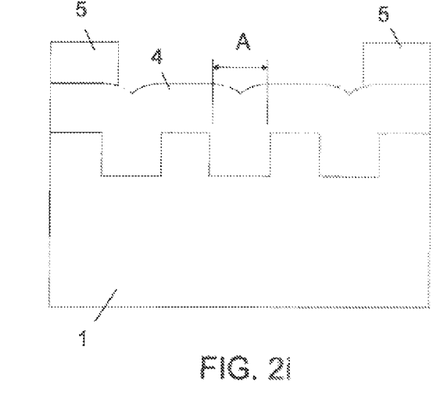
Figure 2J:
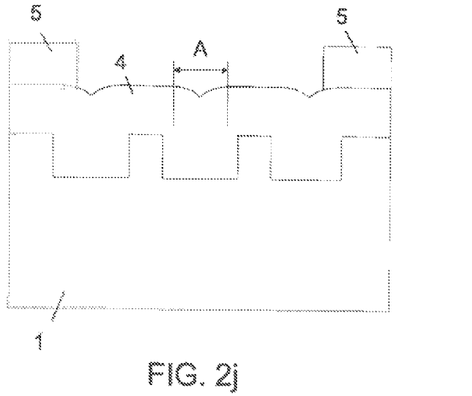
Figure 2K:
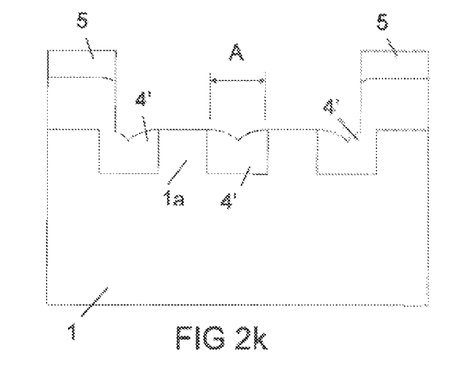
Figure 2L:
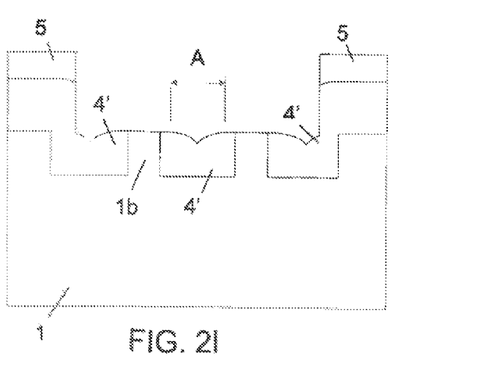
Figure 2M:
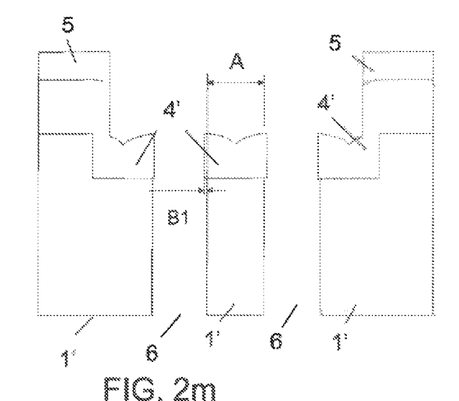
Figure 2N:
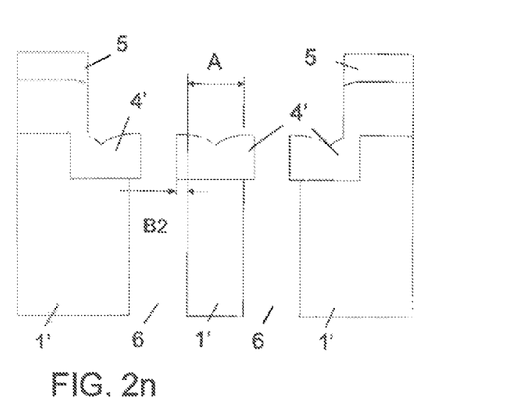
Figure 2O:
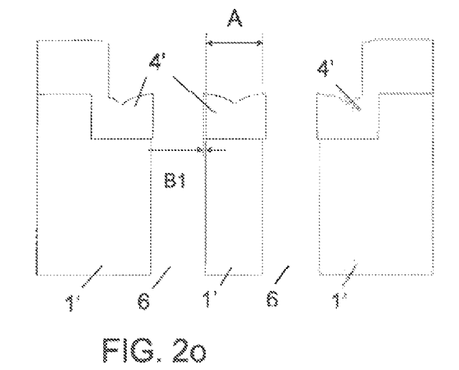
Figure 2P:
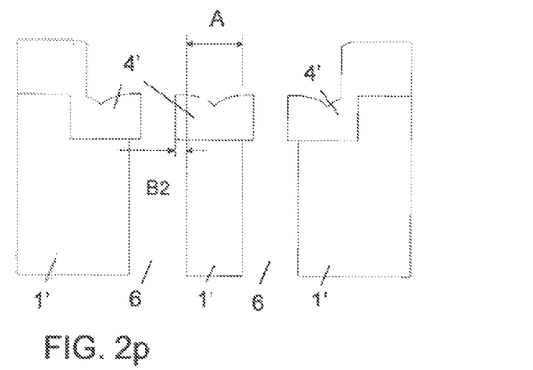
Figure 2Q:
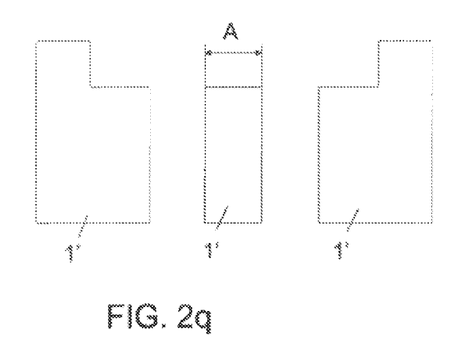
Figure 2R:
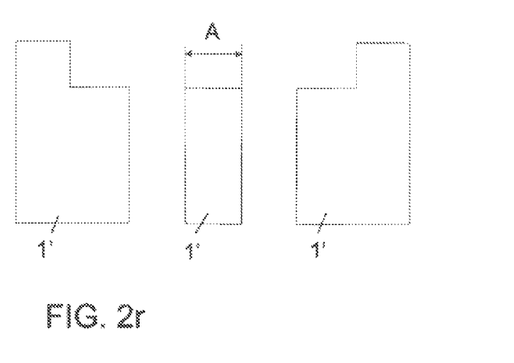

FIGS. 2a-2r principally illustrate successively the method of the invention step by step that compensates for non-uniformities on wafer level. FIGS. 2a, 2c, 2e, 2g, 2i, 2k, 2m, 2o and 2q successively illustrates the method at a part of the wafer that is at the center of the wafer, whereas FIGS. 2b, 2d, 2f, 2h, 2j, 2l, 2n, 2p and 2r illustrates the method successively for a part of the wafer that is at the wafer edge.

As was the case with FIGS. 1a and 1b, FIGS. 2a-2r only show the top layer wafer 1, which in reality is bond to a bottom wafer with an air cavity for the functional structures, as presented in FIGS. 3-5.

In the first step of the embodiment of FIGS. 2a-2r, a first mask 2 is deposited on the wafer 1 to define desired areas on the wafer and to block the remaining areas as is illustrated by FIGS. 2a and 2b. After having deposited the first mask 2 on the wafer 1, the mask 2 is patterned. The patterning shows which parts of the wafer should be etched.

The wafer 1 has to be patterned and etched in order to define the structural features of a sensor in its semiconductor layer. Masking is needed for the etching so that the etching should affect only specific areas of the wafer and block regions where etching is not desired.

The masking can be performed by patterning a deposited masking material or by depositing a patterned masking material on the wafer.

For patterning a deposited masking material, known processes such as photolithography (also called optical lithography) can be used. Photolithography involves the use of a photoresist (PR) material as a mask material in order to generate the specific pattern on the surface of the wafer, i.e. to define the shape of micro-machined structures on the wafer 1.

As an alternative, a silicon dioxide ($SiO_2$) film can be used as a mask material.

Photoresist (PR), being a light-sensitive material, can be processed into a specific pattern by being exposed to light energy in the shape of the desired pattern. The patterning of a photoresist takes place by exposing the material to ultraviolet (UV) light. Once the PR has been patterned, the wafer will be covered by the PR only in specific areas while the remainder of the wafer is uncovered. Photolithography is useful because it can transfer the pattern to the wafer surface very quickly. Direct-write methods (similar to those used to create the optical mask) can also be used but are slower.

In some cases, the chemical strength of the photoresist is not high enough to endure proper etching of the silicon wafer. In such cases an additional layer of more stable material (like silicon dioxide) is added between the photoresist and the wafer. This is called as hard mask.

The dimension A in the figures defines the areas to be etched not covered by the mask. The intention is to etch equal areas both in the center part of the wafer (as shown by FIG. 2a) and in parts at the wafer edge (as shown by FIG. 2b) in accordance with dimension A.

The parts not covered by the mask 2 are then etched in the second step of the method of the invention, as illustrated by FIGS. 2c and 2d, to form shallow first trenches 3a and 3b in an order of ca 0.5-5 μm, e.g. 2 82 m. The etching removes material from the surface of the wafer 1.

The etching steps can be performed by, for example, plasma assisted dry etching, Reactive Ion Etching (RIE) or Deep Reactive Ion Etching, (DRIE). DRIE is a special subclass of RIE. It is a highly anisotropic etch process usually used to create deep penetration, steep-sided holes and trenches in wafers/substrates. RIE "deepness", however, depends on application. In MEMS, DRIE is typically used for anything from a few micrometers to 0.5 mm. In this process, etch depths of hundreds of micrometers are achieved with almost vertical sidewalls. A technology called "Bosch process", where two different gas compositions alternate in the reactor, can be used.

FIGS. 2c and 2d show parts of a silicon wafer structure 1 that have been DRIE-etched on exposed surfaces not covered by a masking layer 2.

This shallow trench etching of step 2 results in a pattern of first trenches 3a and 3b and first structures 1a and 1b of the silicon wafer 1. Parts of the wafer have thus been etched away (in an extent defined by the trenches 3a and 3b) and the first structures 1a and 1b are parts of the silicon wafer 1. The trenches are usually not made deeper than 2 μm to avoid the final structure to be unnecessary low.

FIGS. 2c and 2d show such resulting non-uniformity as was described generally in FIGS. 1a and 1b. The DRIE etching causes a larger undercut B2 at the wafer edge than in the wafer center, wherein the undercut B1 is smaller. In the stage of FIGS. 2c and 2d, A is the dimension for the parts of the wafer not covered by the first mask. B1 and B2 are the distances of the undercut, which is the dimension of the portion that is etched away under the first mask 2. In reality the trenches under the mask 2 tend to have sloping sidewalls since the undercut is less immediately under the mask but is in FIGS. 2c and 2d simplified by presenting the trenches with straight sidewalls.

The distance of undercutting is called bias and its extent varies within the structure. Thus, the etching process causes a larger undercut bias B2 at the wafer edge as can be seen in FIG. 2d than in the wafer center as can be seen in FIG. 2c, wherein the undercut bias B1 is smaller. Therefore the trench dimension is broader at the wafer edge than the trench dimension at the center of the wafer and analogously, the structure dimension is smaller at the wafer edge than the structure dimension at the center of the wafer The process then continues with the third step of the method in mask stripping to remove the first mask 2 away from the substrate as shown in FIGS. 2e and 2f. If a photoresist was used for the mask, a liquid "resist stripper", is used, which chemically alters the mask so that it no longer adheres to the substrate. Alternatively, the photoresist mask may be removed by a plasma containing oxygen, which oxidizes it. This process is called plasma ashing, and resembles dry etching.

In the case of a $SiO_2$ mask, it is removed by hydrofluoride acid (HF) or alternatively, the $SiO_2$ mask is not removed in this stage yet but later.

One or more masking materials, such as silicon dioxide, is then deposited in a fourth step shown by FIGS. 2g and 2h as a layer 4 to fill the trenches 3a and 3b by chemical vapor deposition (CVD). For CVD, silicon dioxide ($SiO_2$) is an ideal material because of its conformal deposition properties. In this step, the wafer (substrate) is exposed to one or more volatile precursors, which react and/or decompose on the substrate surface to produce the desired deposit of $SiO_2$.

Metal is also a possible masking material, and in that case, Physical Vapor Deposition, PVD, including sputtering, is used rather than CVD. Other possible methods for the deposition of the metal is electro-deposition or electroless deposition.

To get the silicon dioxide ($SiO_2$), e.g. TEtraethyl Ortho-Silicate (TEOS) can preferably be used as a precursor since TEOS has a remarkable property to decompose into silicon dioxide. Tetraethyl orthosilicate is the chemical compound with the formula $Si(OC_2H_5)_4$.

Also a silane can be used as a precursor to silicon dioxide and can be applied to substrates under dry aprotic conditions by CVD, which favors monolayer deposition. Silanes are saturated hydrosilicons, with the general formula $SinH2n+2$. The simpliest silane is an inorganic compound with chemical formula $SiH_4$. Silane may also refer to many compounds containing silicon, such as trichlorosilane ($SiHCl_3$) and tetramethylsilane ($Si(CH_3)_4$). Under proper conditions almost all silanes can be applied to substrates in the vapor phase.

Instead of CVD, Spin-On-Glass deposition can be used. Spin-on Glass (SOG) is an interlevel thin film dielectric material used as insulation and as a planarization layer. It is spin-coated onto a silicon wafer to fill even submicron gaps in the pre-metal and metal levels while planarizing the surfaces. After drying and curing/sintering, the spincoated liquid film turns into a Si—O network thin film material with a performance similar to $SiO_2$.

FIGS. 2i and 2j show a fifth step of this embodiment, wherein a third mask 5 is deposited as an intermediate mask on the silicon dioxide trench filling 4 on selected areas. The third mask 5 protects those parts of the trench filling 4, where no etching should take place for defining the final structures.

In the sixth step, as illustrated by FIGS. 2k and 2l, a part of the trench filling 4 of silicon dioxide presented in FIGS. 2i and 2j is removed approximately to the top surface of structures 1a and 1b to reveal the top surface on areas to be etched. The original trenches 3a and 3b are now filled with remaining silicon dioxide oxide. It is left on desired second areas to function as a second mask (4') to define final structures as protected by the third mask 5. Some suitable technique such as chemical-mechanical planarization or lithography and etch back of the silicon dioxide can be used for the removing.

FIGS. 2m-2n show a DRIE etch step for making the final structures as the seventh step of the method of the invention. The DRIE etching of the seventh step results in forming of second trenches 6 and second structures 1'.

As can be seen in FIGS. 2m and 2n, the width of the second mask parts 4' is in the original trenches now larger in areas wherein the DRIE etch causes a larger undercut, i.e. at the wafer edge (because the original trenches 3b were larger at the wafer edge). This mask over-dimension compensates the undercut to be formed during the DRIE etching and ideally, the final structures 1' (and the second trenches 6) become equally wide in corresponding areas.

Embodiments of the invention can be considered as using inverted masking compared to prior art methods. The first mask 2 primarily protects areas of the wafer not to be etched and defines first structures not to be etched, but, in fact, the first mask 2, at the end, defines the final structures 1' indirectly in a way so that its dimensions become the width of the final trenches 6.

FIGS. 2o-2p shows an eighth step of this embodiment, which includes cleaning of the wafer by stripping the third mask 5 away separately or simultaneously with the second mask 4'.

FIGS. 2q-2r shows a ninth step, in which includes cleaning of the wafer by stripping the second mask 4' away by e.g. hydrofluoride acid (HF) if it was not removed already in connection with removing the third mask 5.

The movable structures 1' are finished by cleaning and they remain lower than the rest of the surface of the wafer 1 in an extent corresponding to the first trench etch depth.

FIGS. 3a-3e together with either FIG. 4a-4d or 5a-5d show generally the method of the invention for providing a complete Cavity-Silicon-On-Insulator (SOI) structure successively step by step by structuring a silicon wafer.

Figure 3A:
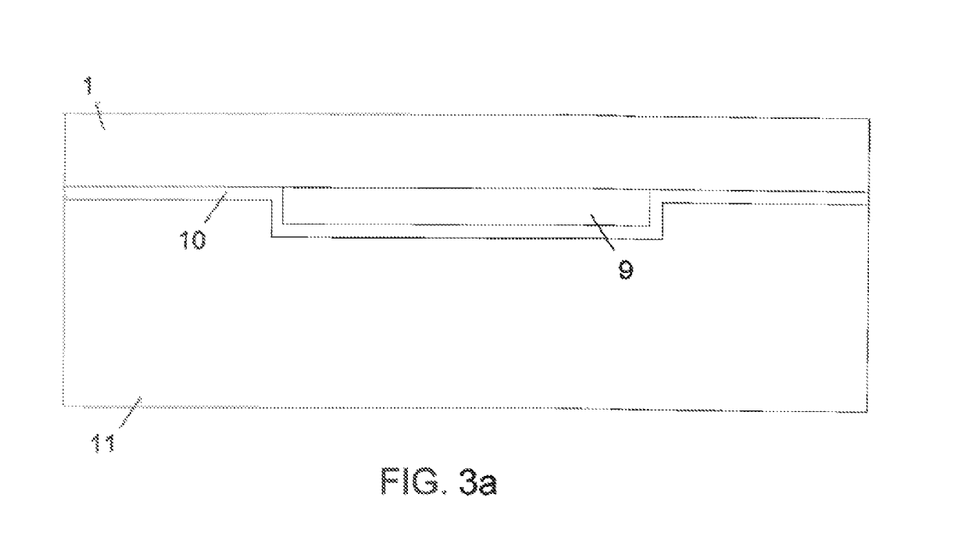
FIGS. 3a-3e shows generally the first part of the method of the invention for providing a complete Cavity-Silicon-On-Insulator (SOI) structure.

FIG. 3a shows a center part of a pre-etched SOI wafer 1 with an air cavity 9, which is a suitable platform for vertically and horizontally moving structures in various applications for MEMS devices, such as capacitive inertial sensors, gyroscopes and accelerators. A silicon bottom wafer 11 is thermally oxidized to form a silicon dioxide, $SiO_2$, layer 10.

The sealed cavity 9 of FIGS. 3-5 intended for MEMS applications was formed by bonding two silicon wafers 1, 11 together, the bottom or "handle" wafer 11 having pre-etched shallow cavities 9. (FIGS. 3-5 show only a part of the wafer having one cavity but there are several cavities in the whole wafer). After bonding, the top layer or "active" wafer 1, is thinned down to form a suspended diaphragm over the cavity 9. The active wafer 1 is in FIGS. 3-5 a SOI wafer. The silicon oxide layer 10 acts as an etch stop after wafer bonding.

Figure 3B:
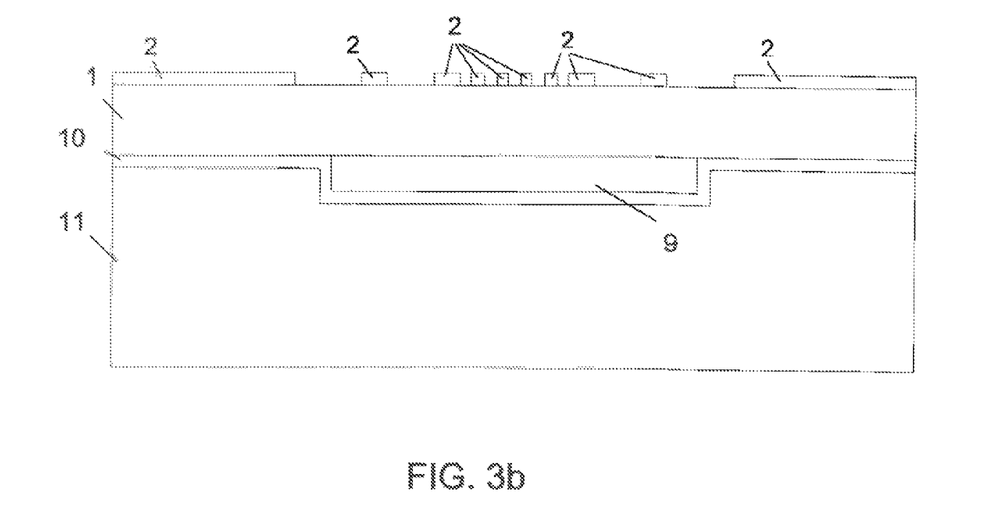

FIG. 3b (correspondingly to FIGS. 2a-2b) shows the first step of the method of the invention, in which a first mask 2 is deposited on the wafer 1 in a pattern to define the areas on the wafer to be etched away and to block the remaining areas from being etched.

Figure 3C:
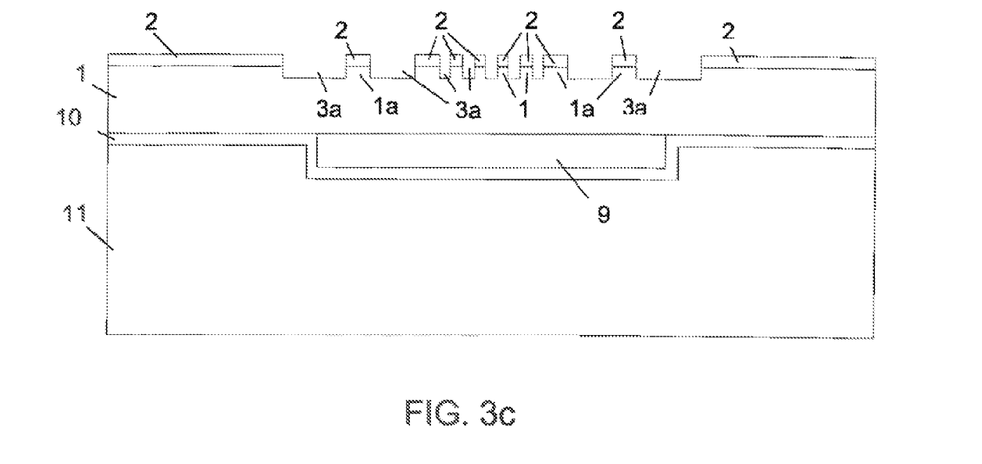

The parts not covered by the mask 2 are then etched in the second step of the method of the invention, as illustrated by FIG. 3c (correspondingly to FIGS. 3c-3d), to form shallow first trenches 3a in an order of ca 2 µm.

The intention in FIGS. 3a-3e together with FIGS. 4a-4d and 5a-5d is only to generally illustrate embodiments of the invention for providing a complete Cavity-Silicon-On-Insulator (SOI) structure. The undercut problem, discussed in connection with FIGS. 1 and 2, is not handled here and only the trenches in the middle of the wafer is presented.

The etching removes material from the surface of the wafer 1. FIG. 3c shows a part of wafer that have been DRIE-etched on exposed surfaces not covered by a masking layer 2.

This shallow trench etching of step 2 results in first trenches 3a and first structures 1a of the silicon wafer 1. Parts of the wafer have thus been etched away and the first structures 1a are parts of the silicon wafer 1.

Figure 3D:
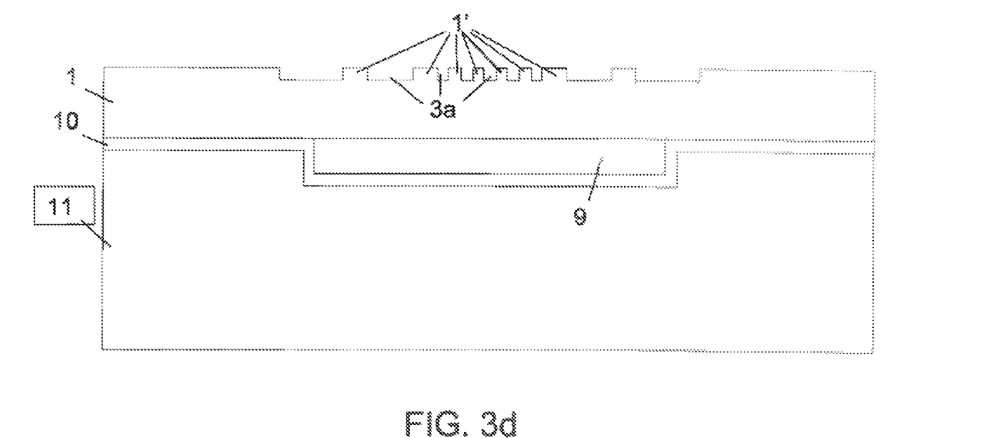

The process then continues with a third step of this embodiment in mask stripping to remove the first mask 2 away from the substrate as shown in FIG. 3d (correspondingly to FIGS. 2e and 2f).

Figure 3E:
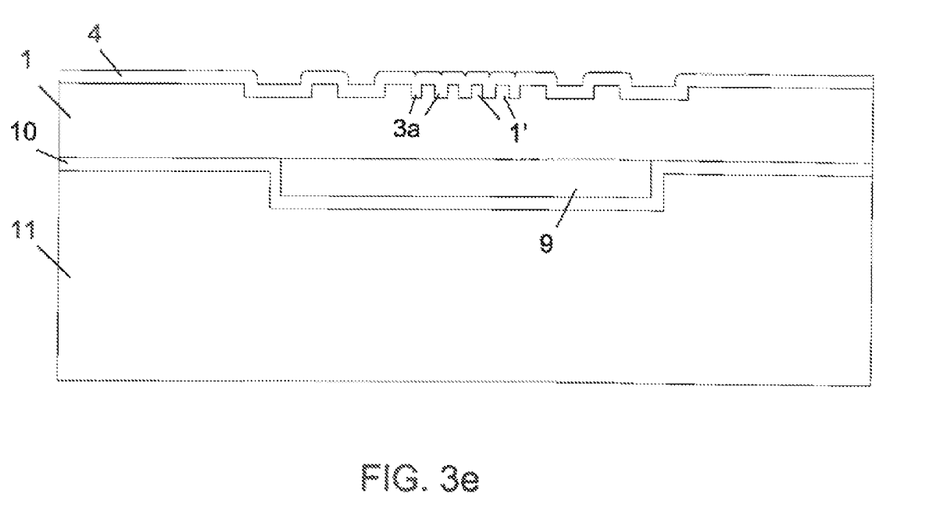

One or more masking materials, such as silicon dioxide, is then deposited in a fourth step shown by FIG. 3e (correspondingly to FIGS. 2g and 2h) as a layer 4 to fill the trenches 3a by chemical vapor deposition.

For the next steps until the final structure, two different alternatives are presented in FIGS. 4a-4d and FIGS. 5a-5d, respectively.

The first embodiment alternative, presented by FIGS. 4a-4d, is an etch-back procedure, wherein a part of the masking material deposited as a trench filling 4 is chemically removed to reveal top surface of the structures 1.

Figure 4A:
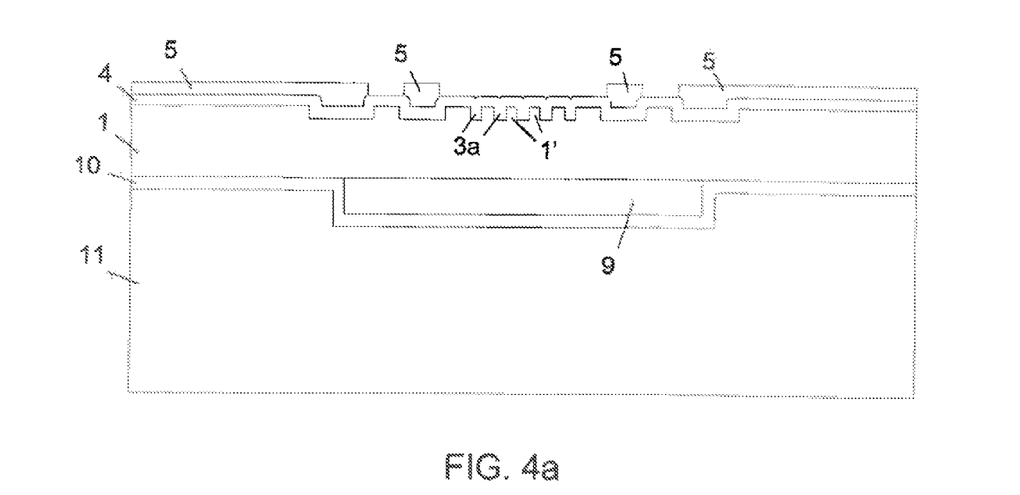
FIGS. 4a-4d shows a first embodiment of the second part of the method of the invention for providing a complete Cavity-SOI structure.

In the first embodiment, FIG. 4a (correspondingly to FIGS. 2i and 2j) shows the fifth step of the method of the invention, wherein a third mask 5 is deposited on the silicon dioxide trench filling 4 on selected areas where etching is not allowed.

Figure 4B:
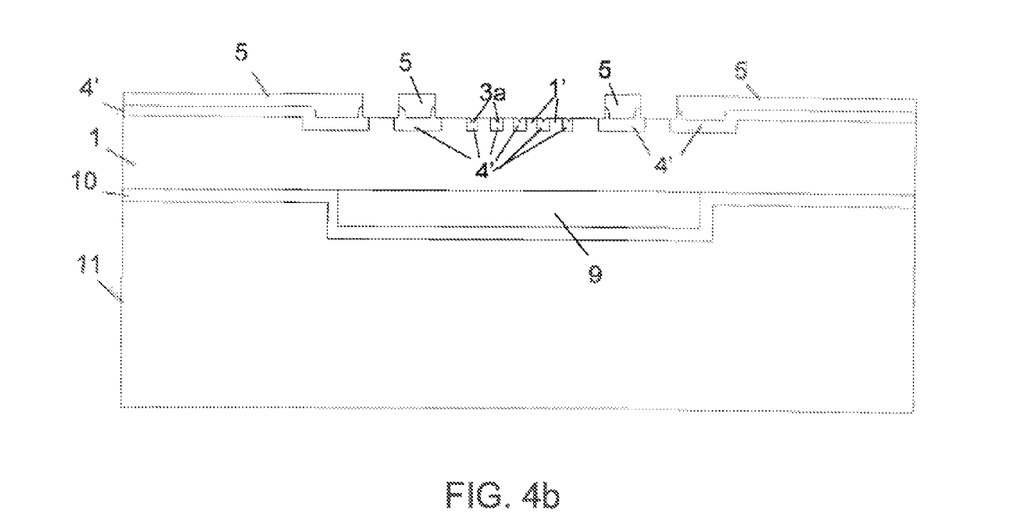

In the next and sixth step, as illustrated by FIG. 4b (correspondingly to FIGS. 2k and 2l), a part of the masking material filling 4 is removed using some suitable technique such as lithography and etch back. The third mask 5 protects the masking material filling 4 on areas defining the final structure and where final structure etching is not allowed.

Figure 4C:
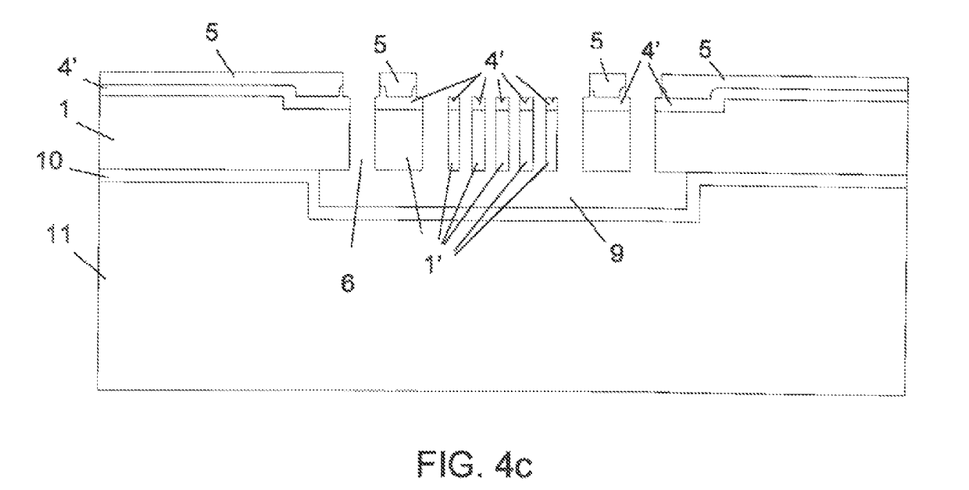

FIG. 4c (correspondingly to FIGS. 2m-2n) shows a DRIE etch step for making the final structures as the seventh step of the method of the invention. The remaining filling 4' act as a second and final structure mask and the DRIE etching of the seventh step results in forming of second trenches 6 and second structures 1'.

Figure 4D:
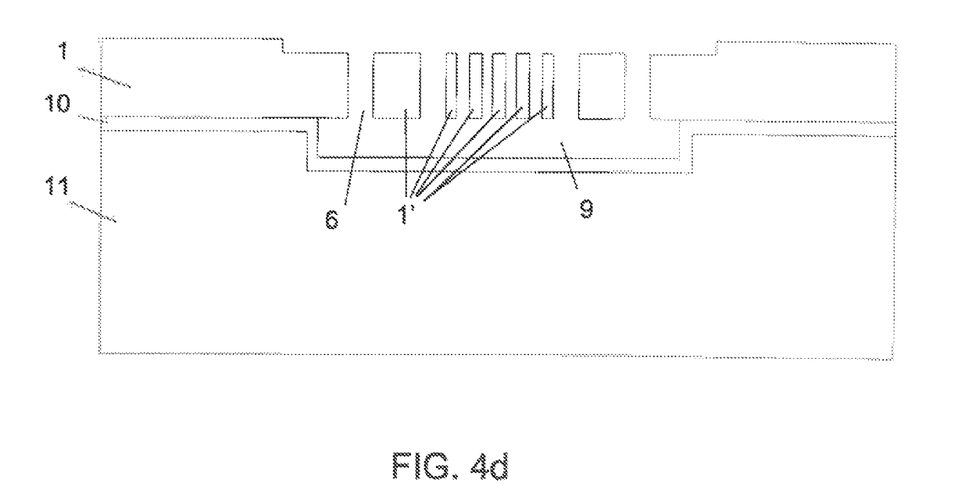

FIG. 4d, correspondingly to FIGS. 2o-2r, shows the result of the eighth and ninth steps of the method consisting in cleaning of the wafer by stripping the third and intermediate mask 5 and the remaining filling 4', which worked as a second and final structure mask 4', away. The movable structures 1' are finished and they remain lower than the resting surface of the wafer 1 in an extent corresponding to the first trench etch depth.

Figure 5A:
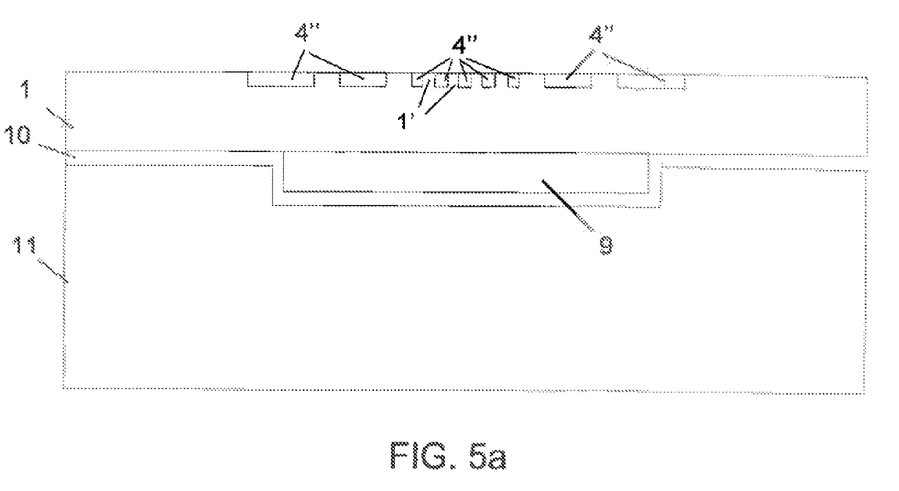
FIGS. 5a-5d shows a second embodiment of the second part of the method of the invention for providing a complete Cavity-SOI structure.

An alternative fifth step presented by FIG. 5a follows the fourth step shown by FIG. 3e, in which one or more dielectric materials, such as silicon dioxide, was deposited as a layer 4 to fill the trenches 3a.

In the second embodiment alternative, presented by FIGS. 5a-5d, Chemical Mechanical Polishing/Planarization (CMP) is used to smooth the surface of the wafer and remove filling 4 on areas to be etched. The remaining filling 4' left fills the trenches 3a as shown by FIG. 5a. Chemical Mechanical Polishing/Planarization is a process of smoothing surfaces with the combination of chemical and mechanical forces. It can be thought of as a hybrid of chemical etching and free abrasive polishing. The fifth step presented by FIG. 5a uses the above mentioned CMP process to smooth the surface of the wafer, whereby a part of the silicon dioxide layer 4 is left deposited on the wafer as a remaining filling 4' in the shape of trenches 3a.

Figure 5B:
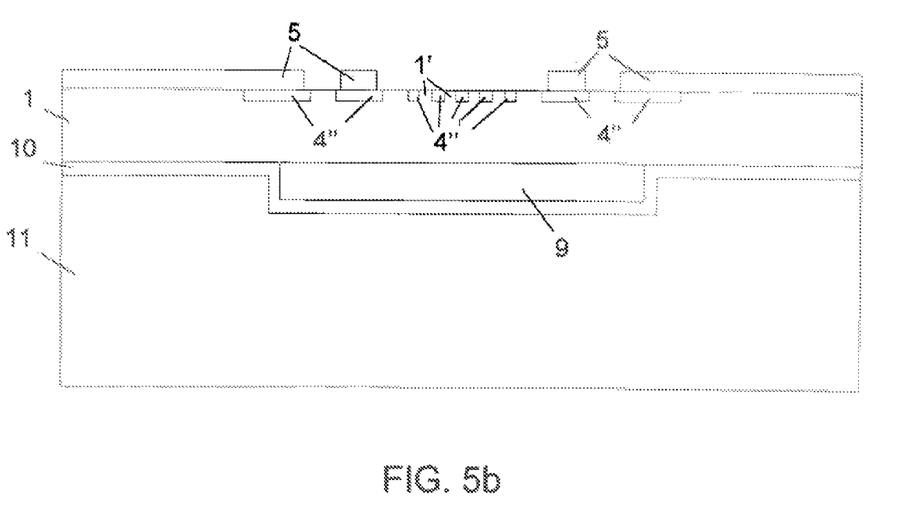

Not until thereafter, in the sixth step of the second embodiment as presented by FIG. 5b, a third mask 5 is deposited as an intermediate mask for defining the final structure in order to protect areas where etching for finals structures is not allowed.

Figure 5C:
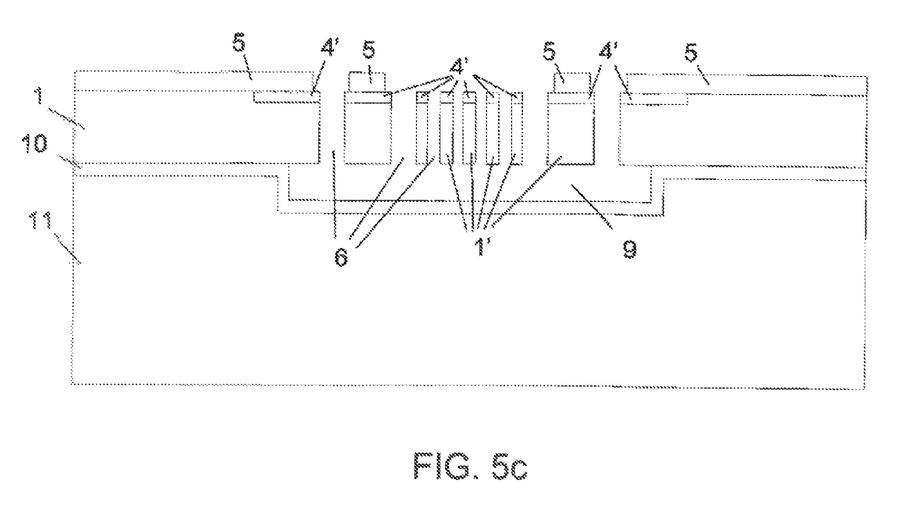
Figure 5D:
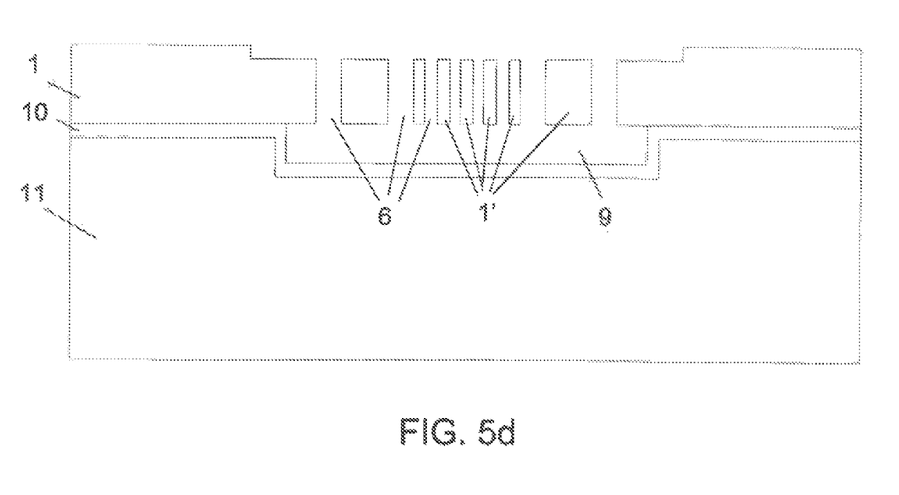

The steps of FIG. 5c-5d correspond to FIGS. 4c-4d.

Thus, FIG. 5c shows a DRIE etch step for making the final structures. The remaining filling 4' act as a second and final structure mask and the DRIE etching results in forming of second trenches 6 and second structures 1'

FIG. 5d illustrates cleaning the wafer by stripping the third mask 5 and the remaining filling, which worked as a second mask 4', away. The movable structures 1' are finished and they remain lower than the resting surface of the wafer 1 in an extent corresponding to the first trench etch depth.

Embodiments of the invention result in structures that are lower than the surface, which is not a problem but rather a benefit since space for structure motion is needed anyway. The method may not provide a very accurate gap depth control but this is not an issue for Z-axis gyroscopes, which do not measure anything in a vertical direction. Therefore the proposed process is very suitable especially for Z-axis gyros but can equally well be used for e.g. accelerators.

Embodiments of the invention result in a complete compensation only in an ideal and simplified case, wherein the etch profile in silicon is assumed to have straight side walls. In reality, there are also other kind of non-realities that make the side wall profile to differ from straight. Therefore, the idea may bring only partial compensation in practice. However, since the non-ideality of the quadrature signal is biggest in a Z-axis gyro, any improvement that reduces the effect is beneficial. The etch process can also be tuned to have more vertical side walls to increase the effect of the compensation. The effect of the compensation can also be increased by making the depth of the first trench etching deeper. This idea also helps in the etch process optimization by releasing the requirement for minimal undercut. This makes the process more robust for defects because allowing some undercut reduces process sensitivity against micromasking caused by particle defects.

The invention claimed is:

1. A method of creating MEMS structures by selectively etching a silicon wafer that is patterned by using masking layers for defining structural features of a MEMS device, the method comprising:
   a) depositing and patterning a first mask on the silicon wafer in order to define desired first areas on the silicon wafer to be etched into first trenches in a first trench etching and to indirectly define desired second areas to be etched in a second trench etching by protecting said second areas not to be etched in said first trench etching;

b) etching the first trenches on parts of the silicon wafer not covered by the first mask in the first trench etching;

c) filling the first trenches with a deposit layer;

d) removing a part of the deposit layer on the desired second areas to be etched in the second trench etching and leaving a remainder on areas to function as a second mask in order to define final structures;

e) etching parts of the silicon wafer on the desired second areas in the second trench etching, wherein dimensions of final structures are indirectly defined by said first mask; and f) removing said second mask.

2. The method of claim 1, further comprising removing the first mask after step b).

3. The method of claim 1, further comprising removing the first mask together with a part of the second mask in connection with step d).

4. The method of claim 1, further comprising depositing a third mask after step c) to protect the deposit layer on areas defining the final structures and removing it together with the second mask in step f).

5. The method of claim 1, further comprising depositing a third mask after step d) to protect the deposit layer on areas defining the final structure and removing it together with the second mask in step f).

6. The method of claim 1, wherein photoresist is used as at least the first, second, or third mask material, and wherein photolithography is used as a mask patterning method.

7. The method of claim 1, wherein silicon dioxide or metal is used as at least the first, second, or third mask material.

8. The method of claim 1, wherein an anisotropic etching process is used as the etching method in step b) or step e).

9. The method of claim 1, wherein the first trench etching results in shallow trenches of 0.4-5 µm.

10. The method of claim 1, wherein the first, second, or third mask is removed by a liquid resist stripper or plasma ashing.

11. The method of claim 1, wherein a dielectric material such as silicon dioxide, $SiO_2$, or a metal is used as the deposit material layer.

12. The method of claim 1, wherein chemical vapor deposition, CVD, is used for depositing the deposit layer.

13. The method of claim 1, wherein metal is used as the deposit material layer, whereby Physical Vapor Deposition, PVD, electro-deposition, or electroless deposition, is used for depositing the deposit layer.

14. The method of claim 1, wherein the second trench etching results in trenches having a depth of 2-100 µm.

15. The method of claim 1, wherein the removing the part of the deposit layer in step d) is performed chemically by an etch-back procedure.

16. The method of claim 1, wherein the removing the part of the deposit layer in step d) is performed by Chemical-Mechanical Planarization, CMP.

17. A method of manufacturing a gyroscope, said method comprising the method of claim 1, with structures of the method being dimensioned in a manner which is suitable for a gyroscope.

18. A method for manufacturing an accelerator using the method of claim 1, wherein structures of the method are dimensioned suitable for an accelerator.

19. The method according to claim 8, wherein the anisotropic etching process comprises Deep Reactive Ion Etching (DRIE).

* * * * *